US012796375B2

(12) United States Patent
Kim et al.

(10) Patent No.: US 12,796,375 B2
(45) Date of Patent: Nov. 10, 2026

(54) INSULATOR RING ASSEMBLY AND SUBSTRATE PROCESSING APPARATUS

(71) Applicant: TES CO., LTD, Yongin-si (KR)

(72) Inventors: Sung-Ho Kim, Yongin-si (KR); Nam-Seo Kim, Yongin-si (KR); Yeong-Hyeon Hwang, Yongin-si (KR); Seung-Hwan Jeon, Yongin-si (KR); Hye-Ok Kim, Yongin-si (KR); Du-Ho Kang, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 455 days.

(21) Appl. No.: 18/389,746

(22) Filed: Dec. 19, 2023

(65) Prior Publication Data

US 2024/0213051 A1 Jun. 27, 2024

(30) Foreign Application Priority Data

Dec. 21, 2022 (KR) ........................ 10-2022-0180251

(51) Int. Cl.
*H10P 72/00* (2026.01)

(52) U.S. Cl.
CPC ...... *H10P 72/0432* (2026.01); *H10P 72/0402* (2026.01); *H10P 72/0468* (2026.01); *H10P 72/0602* (2026.01)

(58) Field of Classification Search
CPC ......... C23C 16/45565; C23C 16/45563; H01J 37/32642
See application file for complete search history.

(56) References Cited

U.S. PATENT DOCUMENTS

| | | | | |
|---|---|---|---|---|
| 2004/0000375 A1* | 1/2004 | Liu | H01J 37/32642 | 156/345.48 |
| 2005/0061447 A1* | 3/2005 | Kim | H01J 37/32623 | 156/345.51 |
| 2005/0099135 A1* | 5/2005 | Landis | H01J 37/32642 | 315/111.41 |
| 2008/0236494 A1* | 10/2008 | Kawaguchi | H01J 37/32082 | 118/723 R |
| 2014/0110057 A1* | 4/2014 | Lee | C23F 1/08 | 156/345.3 |
| 2015/0318150 A1* | 11/2015 | Fischer | H01J 37/32091 | 156/345.28 |
| 2019/0267217 A1* | 8/2019 | Nagaiwa | H01J 37/32642 | |
| 2020/0098550 A1* | 3/2020 | Takahashi | H01J 37/32642 | |
| 2020/0176226 A1* | 6/2020 | Tsukahara | H01J 37/32568 | |

FOREIGN PATENT DOCUMENTS

| | | |
|---|---|---|
| KR | 10-1998-0009511 A | 4/1998 |
| KR | 10-2021-0082783 A | 7/2021 |

* cited by examiner

*Primary Examiner* — Joseph A Miller, Jr.
(74) *Attorney, Agent, or Firm* — Paratus Law Group, PLLC

(57) ABSTRACT

Provided is an insulator ring assembly and a substrate processing apparatus, and more particularly an insulator ring assembly and a substrate processing apparatus, for reducing a deviation of an extinction coefficient K between an edge and a central part of a substrate when a process is performed on the substrate.

8 Claims, 11 Drawing Sheets

220 : 220A, 220B, 220C, 220D

[Comparative Example]

[Example 1]

[ Example 2]

INSULATOR RING ASSEMBLY AND SUBSTRATE PROCESSING APPARATUS

CROSS-REFERENCE TO RELATED APPLICATION

This application is based on and claims priority under 35 U.S.C. § 119 to Korean Patent Application No. 10-2022-0180251, filed on Dec. 21, 2022, in the Korean Intellectual Property Office, the disclosure of which is incorporated by reference herein in its entirety.

TECHNICAL FIELD

The present disclosure relates to an insulator ring assembly and a substrate processing apparatus, and more particularly, to an insulator ring assembly and a substrate processing apparatus, for reducing a deviation of an extinction coefficient K between an edge and a central part of a substrate when a process is performed on the substrate.

BACKGROUND

Recently, with the miniaturization and integration of semiconductors, a demand for amorphous carbon layer hard masks that require high selectivity and high uniformity has increased. A deposition temperature for forming such a high-selectivity amorphous carbon layer (ACL) is approximately 600° C. or higher.

However, even if a temperature of a heater that heats a substrate to form the ACL rises above 600° C., the temperature of a chamber remains at approximately 75° C.

In other words, a heat loss occurs due to a significant temperature difference between the heater and the chamber. A shape of the inside of the chamber is asymmetrical due to various components, and in particular, a heat loss occurs due to an opening through which a substrate is put into the chamber. Due to this heat loss, a deviation of the thickness and extinction coefficient K of the ACL between a central portion and an edge of a substrate increases.

SUMMARY

To overcome the above problem, an object of the present disclosure is to provide an insulator ring assembly and a substrate processing apparatus, for reducing a deviation of an extinction coefficient K between an edge and a central part of a substrate when a process is performed on the substrate.

According to an aspect of the present disclosure, an insulator ring assembly includes an insulator ring body with at least a portion of an inner side in which a step is formed, and at least one coupling plate detachably connected to the step.

A width of the coupling plate may be equal to or less than a width of the step.

A protrusion may be formed on one of the step and the coupling plate and a groove may be formed in the other one.

When a plurality of coupling plates are provided, at least one of the plurality of coupling plates may have different materials.

The coupling plate may include an insulative first plate and a conductive second plate.

When a plurality of coupling plates are provided, the plurality of coupling plates may be stacked on the step in a height direction.

When the plurality of coupling plates are stacked on the step in the height direction, a total height of the plurality of coupling plates may be equal to or less than a height of the step.

A through hole may be formed in each of the plurality of coupling plates, and a connection pin may be further disposed to pass through the through hole.

According to another aspect of the present disclosure, a substrate processing apparatus includes a chamber providing a processing space for a substrate, a showerhead provided inside the chamber and configured to supply a process gas toward the substrate, and an insulator ring assembly electrically insulating between the showerhead and the chamber, wherein the insulator ring assembly includes an insulator ring body with at least a portion of an inner side in which a step is formed, and at least one coupling plate detachably connected to the step.

When a plurality of coupling plates are provided, at least one of the plurality of coupling plates may have different materials.

When a plurality of coupling plates are provided, the plurality of coupling plates may be stacked on the step in a height direction.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, the configuration of an insulator ring assembly and a substrate processing apparatus according to an embodiment of the present disclosure will be described in detail.

Figure 1:
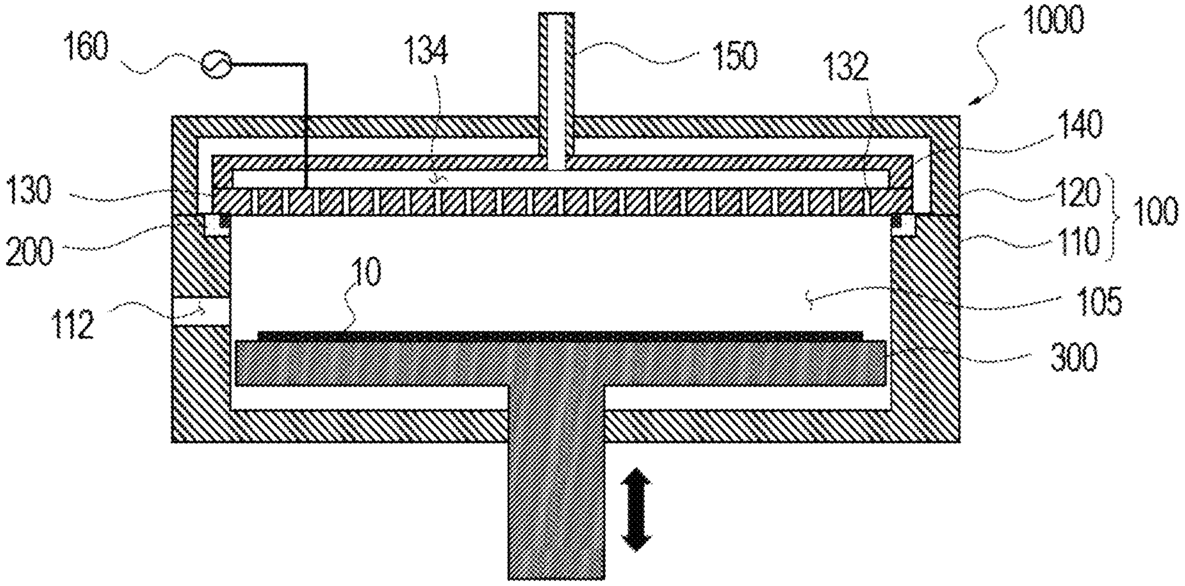
FIG. 1 is a side cross-sectional view of a substrate processing apparatus according to an embodiment of the present disclosure.

FIG. 1 is a side cross-sectional view of a substrate processing apparatus 1000 according to an embodiment of the present disclosure.

Referring to FIG. 1, the substrate processing apparatus 1000 may include a chamber 100 providing a processing space 105 for a substrate 10, and a showerhead 130 provided inside the chamber 100 and configured to supply a process gas toward the substrate 10. The substrate processing apparatus 1000 may further include a substrate support 300 on which the substrate 10 is accommodated inside the chamber 100.

The chamber 100 provides the processing space 105 in which various processing processes are to be performed on the substrate 10.

The chamber 100 may include, for example, a chamber body 110 and a chamber lid 120. The chamber body 110 is formed to have an open top, and the open top of the chamber body 110 is sealed by the chamber lid 120. An opening 112 for retracting and extending the substrate 10 into and out of the chamber body 110 may be formed at one side of the chamber body 110, and a door (not shown) for sealing the opening 112 may be provided.

The substrate support 300 supporting the substrate 10 may be provided at a lower portion of the chamber 100. The substrate support 300 may be moveably provided up and down. The substrate support 300 may include a heater (not shown) to heat the substrate 10 to a process temperature during a process for the substrate 10.

The showerhead 130 configured to supply a process gas for the substrate 10 may be provided at an upper portion of the inside of the chamber 100. For example, a plurality of supply holes 132 may be formed in the showerhead 130.

The showerhead 130 may be provided above the processing space 105. For example, as shown in FIG. 1, the showerhead 130 may be accommodated on and supported by an upper end of the chamber body 110. A support structure of the showerhead 130 is described as an example, and may be modified and applied in various ways.

A supply line 150 supplying various process gases may be connected to the chamber lid 120. A process gas supplied through the supply line 150 may be supplied to a diffusion space 134.

For example, a gas plate 140 may be connected to an upper portion of the showerhead 130, and a space between a lower surface of the gas plate 140 and an upper surface of the showerhead 130 may define the aforementioned diffusion space 134.

Accordingly, the process gas supplied through the supply line 150 may pass through the diffusion space 134 and may be supplied to the processing space 105 through the showerhead 130.

When various processing processes are performed on the substrate 10, plasma may be used to increase the efficiency of the processing process. In this case, a radio frequency (RF) power supply 160 may be connected to the showerhead 130 to apply RF power to the showerhead 130. The showerhead 130 itself may function as an RF power electrode, or, although not shown in the drawing, a separate RF power electrode may also be provided.

The RF power supply 160 may be connected to the aforementioned gas plate 140 to apply RF power to the showerhead 130. The configuration of the showerhead 130 and the supply line 150 is simply described as an example and may be appropriately modified and applied.

When RF power is applied to the showerhead 130, the substrate support 300 provided at an opposite side of the showerhead 130 inside the chamber 100 may function as a ground electrode.

As described above, when RF power is applied to the showerhead 130, an insulator ring assembly 200 may be provided to electrically insulate between the showerhead 130 and the chamber body 110.

Recently, with the miniaturization and integration of semiconductors, a demand for amorphous carbon layer hard masks that require high selectivity and high uniformity has increased. A deposition temperature for forming such a high-selectivity amorphous carbon layer (ACL) is approximately 600° C. or higher.

However, even if a temperature of a heater of the substrate support 300 to form the ACL rises above 600° C., the temperature of the chamber body 110 remains at approximately 75° C. In other words, a heat loss occurs due to a significant temperature difference between the heater and the chamber body 110. A shape of the inside of the chamber 100 is asymmetrical due to various components, and in particular, a heat loss occurs due to an the opening 112 of the chamber 100. Due to this heat loss, a deviation of the thickness and extinction coefficient K of the ACL between a central portion and an edge of the substrate 10 increases.

To overcome the above problem, according to the present disclosure, the uniformity of an extinction coefficient K between a central part and an edge of the substrate 10 is improved by the insulator ring assembly 200 described above.

Figure 2:
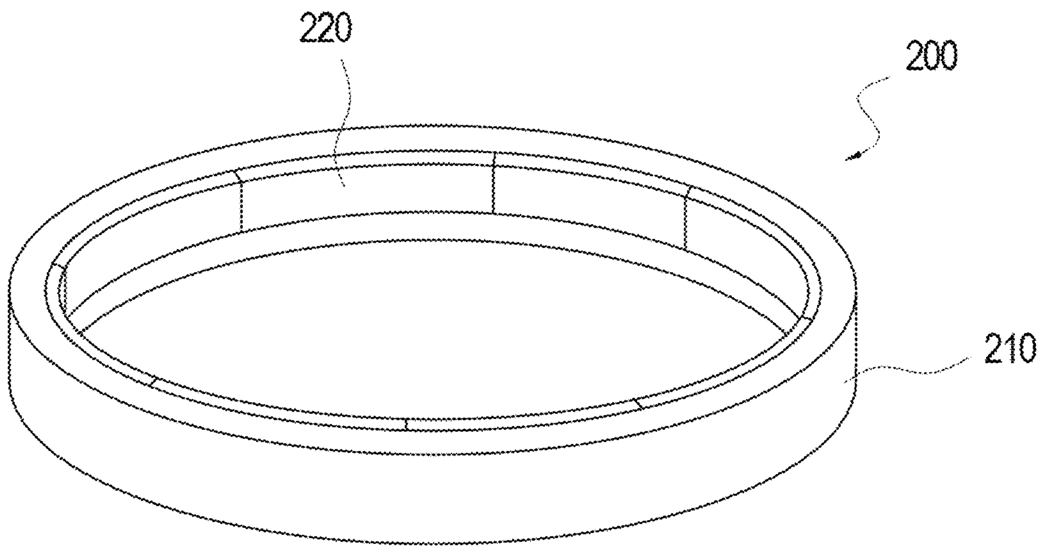
FIG. 2 is a perspective view of an insulator ring assembly.
Figure 3:
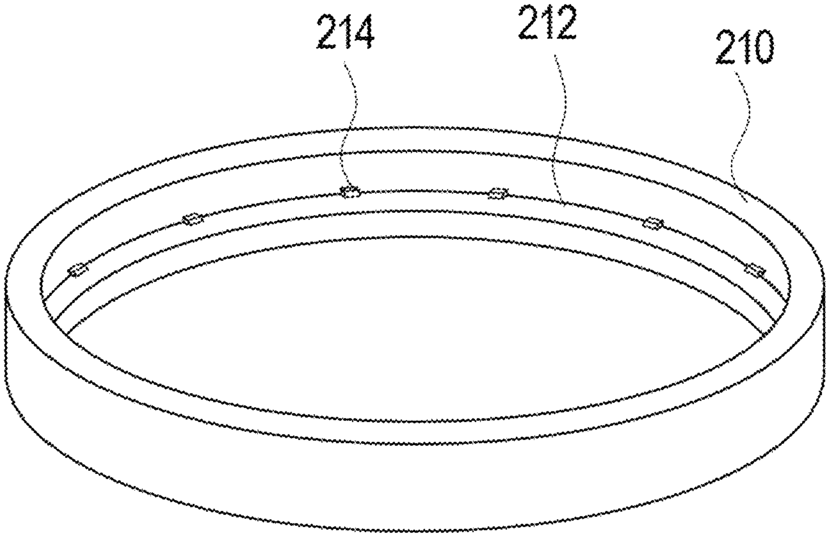
FIG. 3 is a perspective view of an insulator ring body from which a coupling plate is omitted.
Figure 4:
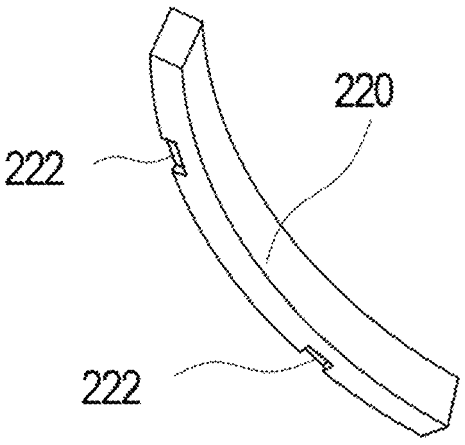
FIG. 4 is a lower perspective view of a coupling plate.

FIG. 2 is a perspective view of the aforementioned insulator ring assembly 200. FIG. 3 is a perspective view of an insulator ring body 210 from which a coupling plate 220 is omitted. FIG. 4 is a lower perspective view of the coupling plate 220.

Referring to FIGS. 2 to 4, the insulator ring assembly 200 may include the insulator ring body 210 with at least a portion of an inner side in which a step 212 is formed, and at least one coupling plate 220 detachably connected to the step 212.

The insulator ring body 210 may be formed to correspond to a shape of the substrate 10. For example, as shown in the drawings, the insulator ring body 210 may be formed to be approximately circular, but it is not limited thereto and may be appropriately modified. The insulator ring body 210 may include an insulative material to electrically insulate the showerhead 130 and the chamber body 110.

The step 212 may be formed in at least a portion an inner side of the insulator ring body 210. In the drawings, the step 212 is shown as being formed on an entire inner side of the insulator ring body 210, but is not limited thereto. That is, although not shown in the drawings, the step 212 may be formed on an inner portion alone of the insulator ring body 210, and the coupling plate 220 may be connected to the step 212. Hereinafter, as shown in the drawings an embodiment in which the step 212 is formed along the entire inside of the insulator ring body 210 as shown in the drawing will be described.

At least one coupling plate 220 may be detachably connected to the step 212 described above.

The coupling plate 220 may be detachably connected to the step 212, and may reduce a heat loss of the substrate 10 described above and improve the uniformity of the extinction coefficient K.

The coupling plate 220 may be formed to correspond to a shape of the step 212. For example, when the step 212 is formed in a circular shape, the coupling plate 220 may be formed in an arc shape.

In this case, when the coupling plate 220 is accommodated on the step 212, the coupling plate 220 may not protrude inward from the insulator ring body 210. That is, a width of the coupling plate 220 may be less than or equal to a width of the step 212. As a result, the symmetry or uniformity of the processing space 105 with respect to the substrate 10 may be improved.

The coupling plate 220 may be detachably connected to the step 212. In this case, a coupling device may be provided to determine a coupling position of the coupling plate 220.

For example, a protrusion 214 may be formed on one of the step 212 and the coupling plate 220, and a groove 222 may be formed in the other one. According to the present embodiment, the protrusion 214 is formed on the step 212 and the groove 222 is formed in the coupling plate 220, but the present disclosure is not limited thereto.

When the coupling plate 220 is accommodated on the step 212, the protrusion 214 of the step 212 is inserted into the groove 222 of the coupling plate 220 to determine the position of the coupling plate 220.

When the step 212 is formed inside the insulator ring body 210, a plurality of coupling plates 220 may be accommodated on the step 212. For example, FIG. 2 illustrates the case in which eight coupling plates 220 are coupled to the insulator ring body 210, but the number of the coupling plates 220 may be appropriately adjusted and is not particularly limited thereto.

When the coupling plate 220 is provided in a plural number, at least one of the plurality of coupling plates 220 may have different materials.

Figure 5:
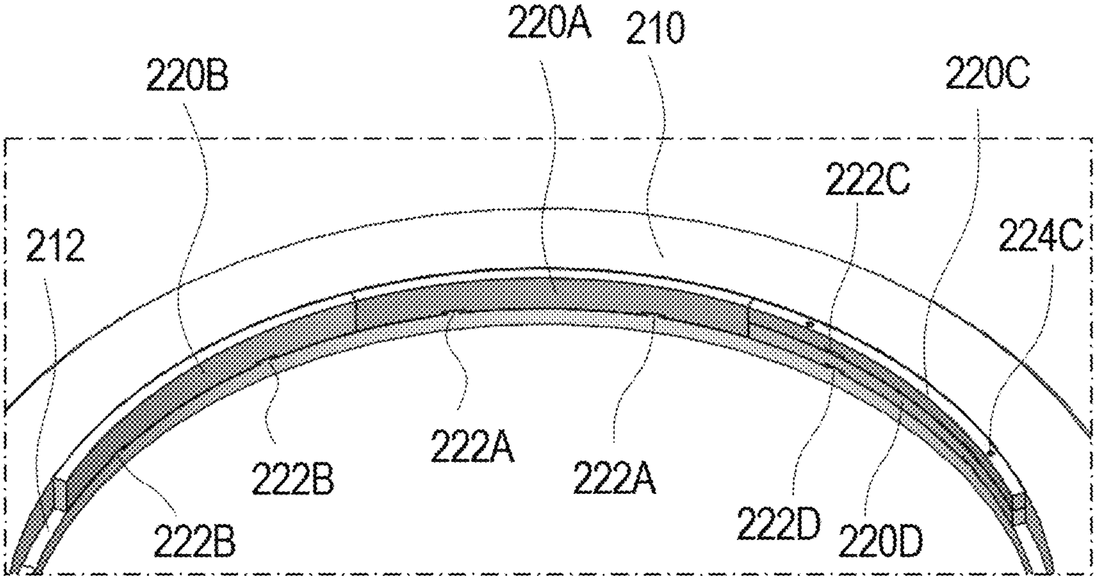
FIG. 5 is a partial enlarged perspective view of an insulator ring assembly.

FIG. 5 is a partial enlarged perspective view of the insulator ring assembly 200.

Referring to FIG. 5, the coupling plate 220 may include an insulative first plate 220A and a conductive second plate 220B.

For example, the first plate 220A may be made of insulating ceramic, for example, alumina ($Al_2O_3$). The second plate 220B may be made of a conductive metal, such as aluminum (Al).

As such, when a material of the coupling plate 220 is changed, properties such as heat reflection and heat absorption by the coupling plate 220 may change. Therefore, a heat loss of the substrate 10 may be minimized and the uniformity of an extinction coefficient K may be improved by coupling the coupling plate 220 including a material appropriate for a process condition or environment for the substrate 10 to an appropriate coupling position of the insulator ring body 210.

A first groove 222A and a second groove 222B as described above may be formed in the first plate 220A and the second plate 220B, respectively.

The plurality of coupling plates 220 may be stacked on each other and connected to each other in a height direction or perpendicular direction of the step 212.

For example, as shown in FIG. 5, a third plate 220C and a fourth plate 220D may be stacked and coupled in a height direction on the step 212.

That is, the height of the third plate 220C and the fourth plate 220D may be different from the above-described first plate 220A and the second plate 220B.

In this case, the total height of the plurality of coupling plates 220C and 220D may be less than or equal to the height of the step 212.

For example, the third plate 220C and the fourth plate 220D may correspond to ½ of the height of the first plate 220A and the second plate 220B, respectively. Alternatively, the third plate 220C and the fourth plate 220D may correspond to ½ of the height of the step 212.

Therefore, even when the third plate 220C and the fourth plate 220D are stacked on the step 212 in a height or vertical direction, an upper end of each of the third plate 220C and the fourth plate 220D may not protrude from an upper end of the insulator ring body 210.

The third plate 220C may be made of insulating ceramic, for example, alumina ($Al_2O_3$). The fourth plate 220D may be made of a conductive metal, such as aluminum (Al).

In other words, when the coupling plate 220 is placed on the insulator ring body 210 to surround the substrate 10, the coupling plates 220 made of different materials may be stacked in a height direction and placed at the same coupling position.

In this case, an insulative third plate 220C may be placed at the bottom and a conductive fourth plate 220D may be placed on top of the third plate 220C, or vice versa.

As such, when the coupling plates 220 are stacked and connected to each other, if a heat loss of the substrate 10 may be minimized and the uniformity of the extinction coefficient K may be improved, fine control may be achieved.

A third groove 222C and a fourth groove 222D may also be formed in the third plate 220C and the fourth plate 220D, respectively. This is to fix a coupling position when the third plate 220C and the fourth plate 220D are accommodated on the step 212.

When the third plate 220C and the fourth plate 220D are stacked and coupled, a device is needed to maintain coupling without separating between the third plate 220C and the fourth plate 220D.

Figure 6:
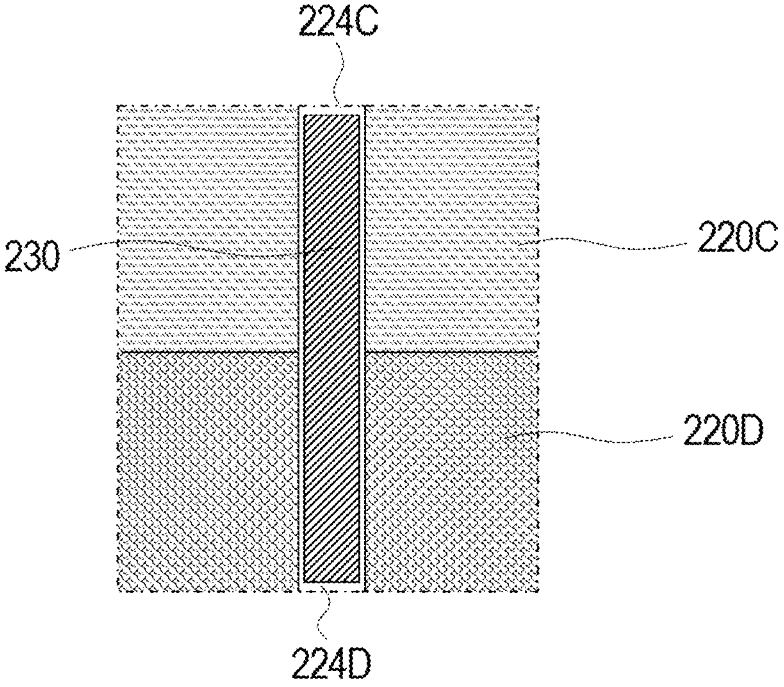
FIG. 6 is a cross-sectional view showing a connection device when a third plate and a fourth plate are stacked and coupled to each other.

FIG. 6 is a cross-sectional view showing a connection device when the third plate 220C and the fourth plate 220D are stacked and coupled to each other.

Referring to FIGS. 5 and 6, a first through hole 224C and a second through hole 224D may be formed in the third plate 220C and the fourth plate 220D, respectively, and a connection pin 230 is disposed to pass through the first through hole 224C and the second through hole 224D.

That is, when the third plate 220C and the fourth plate 220D are stacked and connected, the fourth plate 220D is first accommodated on the step 212. In this case, the position of the fourth plate 220D is determined by inserting the protrusion 214 of the step 212 into the fourth groove 222D of the fourth plate 220D.

Then, the connection pin 230 is inserted and placed into the second through hole 224D of the fourth plate 220D. In this case, an upper portion of the connection pin 230 protrudes from the second through hole 224D.

In this state, the third plate 220C is stacked and connected to an upper portion of the fourth plate 220D, and an upper portion of the connection pin 230 is inserted and connected into the first through hole 224C of the third plate 220C.

The structure connecting the third plate 220C and the fourth plate 220D is described as an example and may be appropriately modified.

In the drawing, the two plates 220C and 220D are shown to be stacked in a height direction on the step 212, but the number of plates to be stacked is not particularly limited and may be adjusted appropriately depending on the height of the step 212.

FIGS. 7A to 9 show experimental results of measuring an extinction coefficient K by performing a test process on the substrate 10 by the substrate processing apparatus 1000 including the insulator ring assembly 200 described above.

Figure 7A:
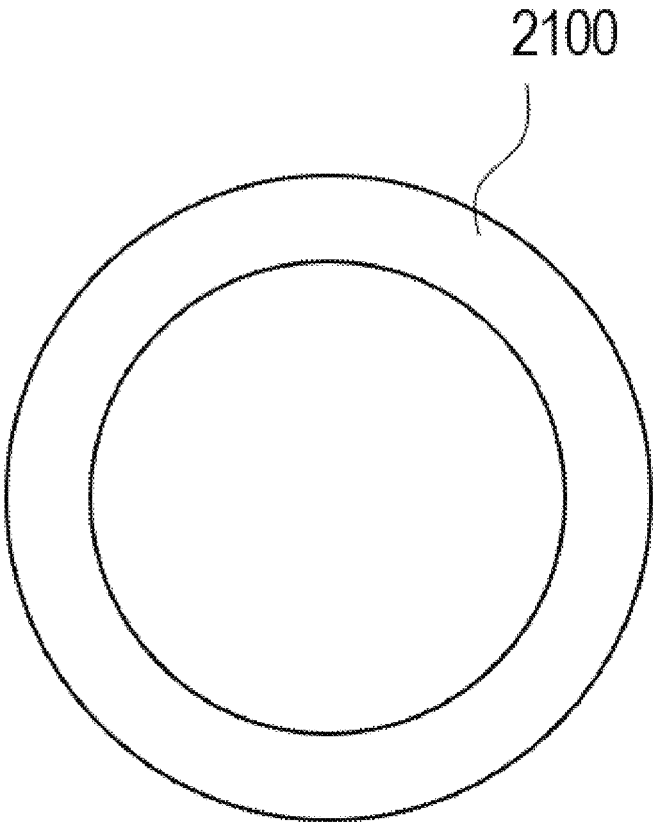
FIGS. 7A, 7B and 7C are plan views showing the configuration of an insulator ring according to Comparative Example, Example 1, and Example 2.
Figure 7B:
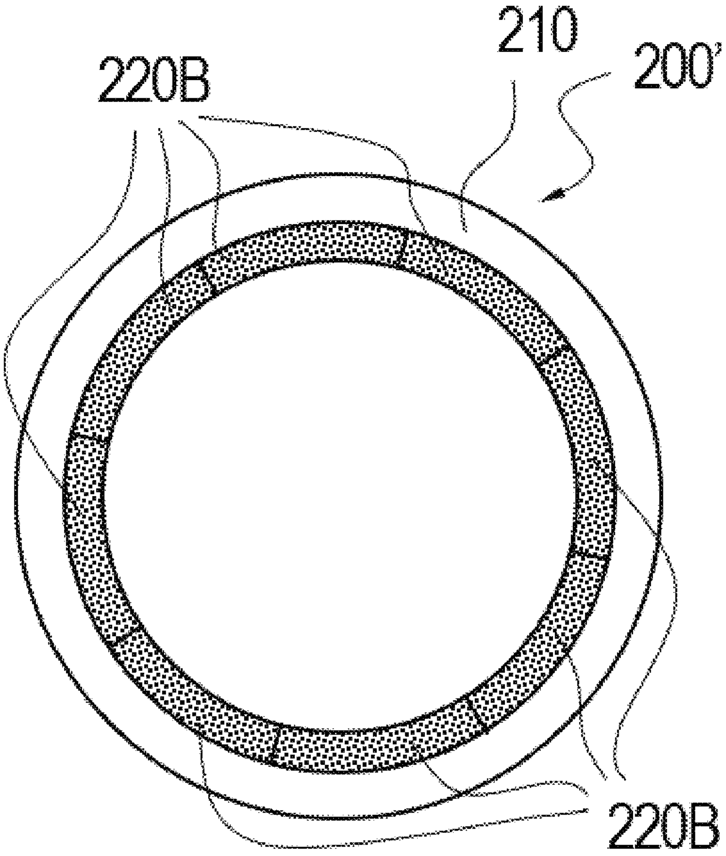
Figure 7C:
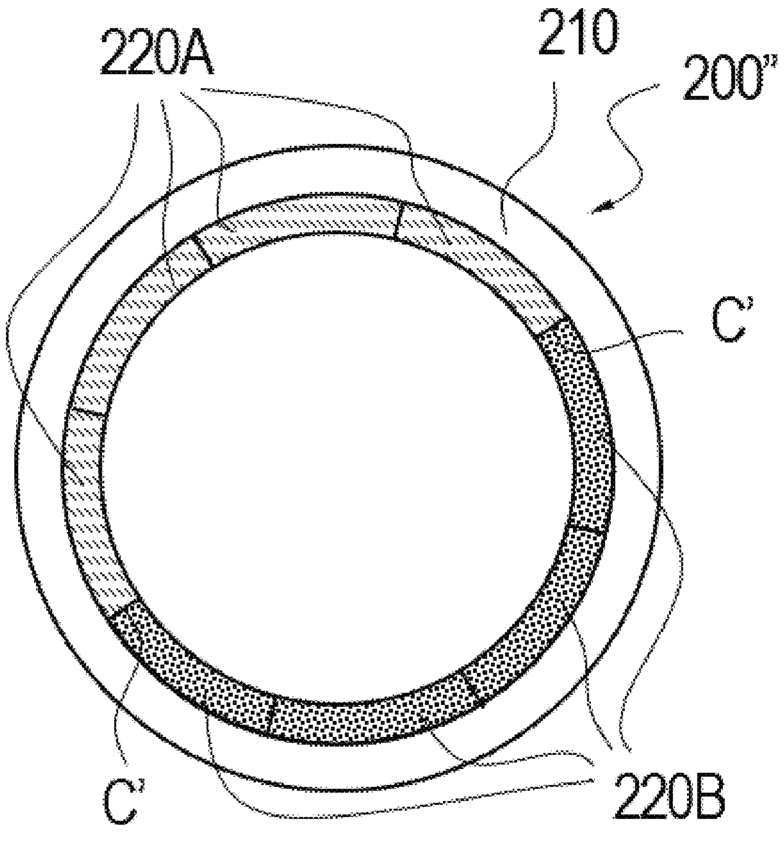

As shown in FIG. 7A, Comparative Example is a result of an experiment with an insulator ring 2100 made entirely of ceramic according to the related art, and as shown in FIG. 7B, Example 1 is a result of an experiment with an insulator ring assembly 200' including the aforementioned conductive second plate 220B alone, and as shown in FIG. 7C, Example 2 is a result of an experiment with an insulator ring assembly 200" in a state in which the aforementioned insulative the first plate 220A and the conductive second plate 220B are installed in half.

That is, compared to the insulator ring 2100 according to Comparative Example, which is entirely made of ceramic, a change in an extinction coefficient K on the substrate 10 was measured with regard to the insulator ring assembly 200' according to Example 1 and the insulator ring assembly 200" according to Example 2.

Figure 8:
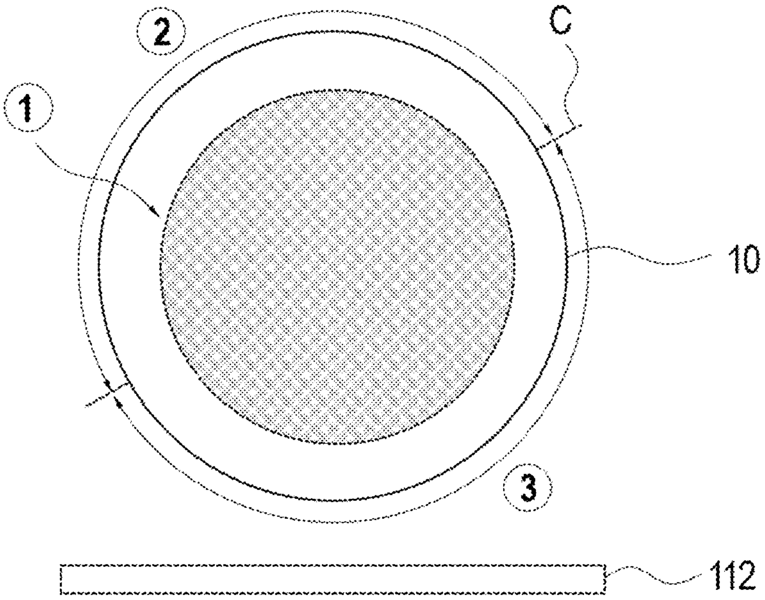
FIG. 8 is a plan view showing the position on a substrate at which an extinction coefficient K is measured.

FIG. 8 is a plan view showing a position on the substrate 10 at which an extinction coefficient K is measured.

As shown in FIG. 8, an extinction coefficient on the substrate 10 was measured in three major regions. The measurements were divided into a first region ① of a central part of the substrate 10, and a second region ② and a third region ③ of an edge. In the first region ①, one or more circular arcs with a certain radius from the center were assumed, and extinction coefficients were measured at approximately 25 points along the arc.

A reference line C of the second region ② and the third region ③ is arranged at an angle diagonally on a roughly flat surface with reference to distribution of an extinction coefficient when tested as a Comparative Example for the substrate 10. In FIG. 7C described above, a dividing line C' that separates the first plate 220A and the second plate 220B from each other is also set to correspond to the reference line C in FIG. 8. However, the arrangement of the reference line C may vary depending on a processing condition for the substrate 10, and thus is not particularly limited.

In a state in which the substrate 10 is disposed as shown in FIG. 8, the opening 112 of the chamber 100 for the substrate 10 is located below the substrate 10, and is located adjacent to the third region ③ of the edge on the substrate 10. When a process is performed in the chamber 100, the opening 112 of the chamber 100 is a region with a large heat loss, and thus the experiment was conducted after confirming the position of the opening 112.

Figure 9:
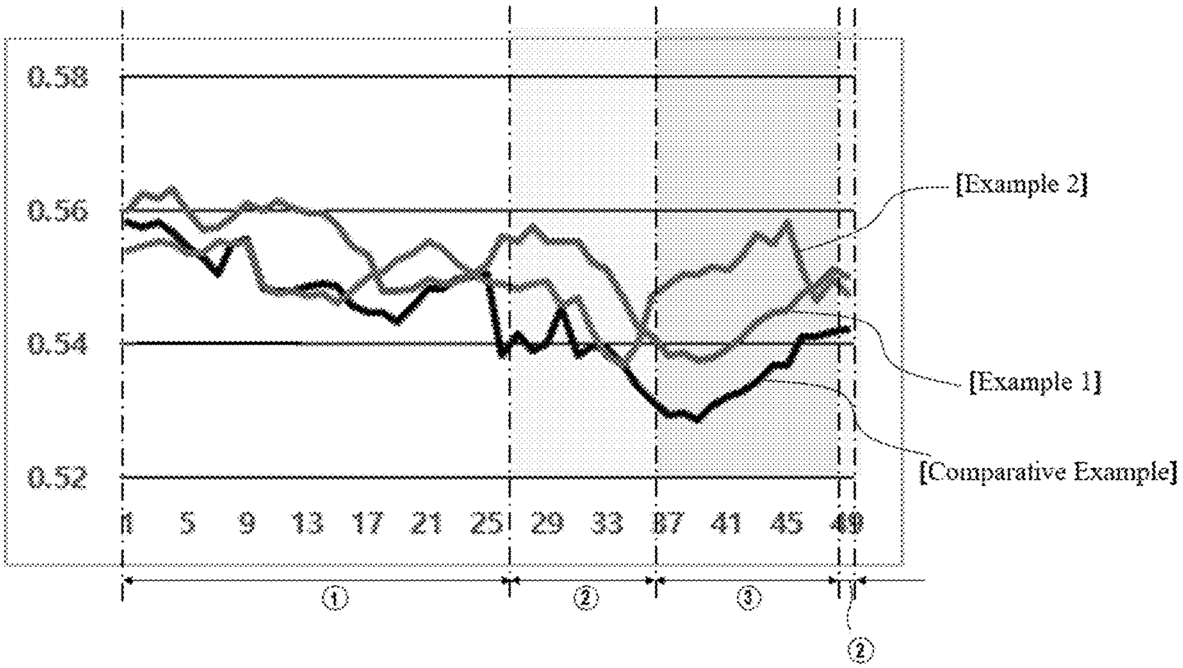
FIG. 9 is a graph showing an extinction coefficient K measured during a process for a substrate according to the configurations of Comparative Example, Example 1, and Example 2.

FIG. 9 is a graph showing an extinction coefficient K measured during a process for the substrate 10 according to the aforementioned configurations of Comparative Example, Example 1, and Example 2. In FIG. 9, a horizontal axis shows a region in which the extinction coefficient is measured, and the vertical axis shows the extinction coefficient.

As seen from FIG. 9, in the case of Comparative Example, compared to the first region ① of the central part, the extinction coefficient drops significantly in the edges ② and ③, and in particular, drops significantly in the third region ③ adjacent to the opening 112.

In the case of Example 1, the overall extinction coefficient is relatively higher than that in Comparative Example. However, even in the case of Example 1, it may be seen that the extinction coefficient is somewhat lowered in the third region ③ adjacent to the opening 112.

In the case of Example 2, it may be seen that a deviation in the overall extinction coefficient is relatively small compared to the Comparative Example and Example 1 as described above. In particular, in the case of Example 2, it may be seen that the extinction coefficient in the third region ③ adjacent to the opening 112 does not decrease, but rather increases to the same level or higher as the measured value of the first region ① and the second region ②.

The results of FIG. 9 described above may also be seen in [Table 1] below. [Table 1] below shows an overall average (Avg.), an overall deviation (Range), and a difference (C-E skew) between a central part and an edge of an extinction coefficient calculated according to the experimental results of FIG. 9.

TABLE 1

| Extinction coefficient | Comparative Example | Example 1 | Example 2 |
|---|---|---|---|
| Avg. | 0.5437 | 0.5517 | 0.5501 |
| Range | 0.0296 | 0.0257 | 0.0212 |
| C-E skew | 0.0137 | 0.0089 | 0.0033 |

As seen from [Table 1], compared to Comparative Example, the overall average value (Avg.) in Example 1 and Example 2 is almost similar but relatively increased, and the overall deviation (Range) is relatively decreased in Example 1 and Example 2 compared to Comparative Example.

In particular, the difference (C-E skew) between the central part and the edge decreased to 65% in Example 1 compared to the Comparative Example, and decreased to 24% in Example 2, and thus it may be seen that the deviation of the extinction between the edge and central part of the substrate 10 is relatively significantly reduced.

According to the present disclosure having the aforementioned configuration, when a process is performed on a substrate, a deviation of an extinction coefficient K between the edge and the central part of the substrate may be reduced.

Although the present disclosure has been described above with reference to exemplary embodiments, those skilled in the art may modify and change the present disclosure in various ways without departing from the spirit and scope of the present disclosure as set forth in the claims described below. Therefore, when the modified implementation basically includes the elements of the claims of the present disclosure, it should be considered to be included in the technical scope of the present disclosure.

What is claimed is:

1. A substrate processing apparatus comprising:

a chamber including a chamber body and providing a processing space for a substrate;

a substrate support provided inside the chamber and configured to support the substrate;

a showerhead provided at an upper portion of the chamber and configured to supply a process gas toward the substrate; and an insulator ring assembly provided between the showerhead and the chamber body and configured to electrically insulate the showerhead from the chamber body, wherein the insulator ring assembly includes:

an insulator ring body with at least a portion of an inner side in which a step is formed; and a plurality of coupling plates detachably connected to the step and arranged in a circumferential direction of the insulator ring body, and wherein the plurality of coupling plates include an insulative first plate and a conductive second plate disposed at different positions in the circumferential direction of the insulator ring body.

2. The substrate processing apparatus of claim 1, wherein a width of each of the plurality of coupling plates is equal to or less than a width of the step.

3. The substrate processing apparatus of claim 1, wherein, for each respective coupling plate of the plurality of coupling plates, a protrusion is formed on one of the step and the respective coupling plate, and a groove is formed in the other of the step and the respective coupling plate.

4. The substrate processing apparatus of claim 1, wherein the insulative first plate is made of an insulating ceramic, and the conductive second plate is made of a conductive metal.

5. The substrate processing apparatus of claim 4, wherein the insulating ceramic comprises alumina, and the conductive metal comprises aluminum.

6. The substrate processing apparatus of claim 1, wherein the plurality of coupling plates further include a third plate and a fourth plate stacked in a height direction at a same position on the step in the circumferential direction of the insulator ring body.

7. The substrate processing apparatus of claim 6, wherein a total height of the third plate and the fourth plate is equal to or less than a height of the step.

8. The substrate processing apparatus of claim 6, wherein a first through hole is formed in the third plate, a second through hole is formed in the fourth plate, and a connection pin is disposed to pass through the first through hole and the second through hole.

* * * * *